United States Patent
Zhang et al.

(10) Patent No.: US 11,187,949 B2
(45) Date of Patent: Nov. 30, 2021

(54) ARRAY SUBSTRATE AND MANUFACTURING METHOD THEREOF, DISPLAY PANEL, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhengdong Zhang, Beijing (CN); Lei Su, Beijing (CN); Xiaofei Yang, Beijing (CN); Mingzhou Guo, Beijing (CN); Xu Liu, Beijing (CN)

(73) Assignee: CHENGDU BOE OPTOELECTRONICS TECHNOLOGY CO., LTD., Sichaun (CN)

( * ) Notice: Subject to any disclaimer, the term of this patent is extended or adjusted under 35 U.S.C. 154(b) by 97 days.

(21) Appl. No.: 16/611,583

(22) PCT Filed: Nov. 22, 2018

(86) PCT No.: PCT/CN2018/116850
§ 371 (c)(1),
(2) Date: Nov. 7, 2019

(87) PCT Pub. No.: WO2019/184400
PCT Pub. Date: Oct. 3, 2019

(65) Prior Publication Data
US 2021/0143183 A1 May 13, 2021

(30) Foreign Application Priority Data
Mar. 27, 2018 (CN) .......................... 201810258985.6

(51) Int. Cl.
*G02F 1/1362* (2006.01)
*G02F 1/1343* (2006.01)
*G02F 1/1368* (2006.01)
*H01L 27/12* (2006.01)
*G02F 1/1335* (2006.01)
(Continued)

(52) U.S. Cl.
CPC ...... *G02F 1/136286* (2013.01); *G02F 1/1368* (2013.01); *G02F 1/13685* (2021.01);
(Continued)

(58) Field of Classification Search
CPC ............. G02F 1/136227; G02F 1/1368; G02F 1/13685; G02F 1/136286; H01L 27/1251
See application file for complete search history.

(56) References Cited

U.S. PATENT DOCUMENTS

2010/0009481 A1   1/2010   Tseng et al.
2017/0068137 A1*  3/2017   Shin ...................... G02F 1/1362
(Continued)

FOREIGN PATENT DOCUMENTS

CN   101393388 A   3/2009
CN   103021944 A   4/2013
(Continued)

OTHER PUBLICATIONS

Second office action of Chinese application No. 201810258985.6 dated Jul. 21, 2020.
(Continued)

*Primary Examiner* — Dung T Nguyen
(74) *Attorney, Agent, or Firm* — Fay Sharpe LLP

(57) ABSTRACT

There is provided an array substrate, a manufacturing method therefor, a display panel, and a display device. The array substrate includes: a base substrate, and a gate metal pattern, a gate insulating layer and a source-drain metal pattern which are sequentially disposed on the base substrate. The gate metal pattern includes a signal line and a gate electrode, the signal line is in the peripheral area, the gate insulating layer is provided with a first via hole penetrating the gate insulating layer, the orthogonal projection of the first via hole on the base substrate and the orthogonal projection of the signal line on the base substrate have an
(Continued)

overlapping area, the source-drain metal pattern includes a source-drain electrode wire, and the source-drain electrode wire is electrically connected to the signal line through the first via hole. The present disclosure achieves the function of protecting the signal line.

17 Claims, 9 Drawing Sheets

(51) Int. Cl.
*H01L 29/40* (2006.01)
*H01L 29/417* (2006.01)

(52) U.S. Cl.
CPC .... *G02F 1/134309* (2013.01); *H01L 27/1251* (2013.01); *G02F 1/133514* (2013.01); *G02F 1/136236* (2021.01); *H01L 27/124* (2013.01); *H01L 27/1288* (2013.01); *H01L 29/401* (2013.01); *H01L 29/41733* (2013.01)

(56) References Cited

U.S. PATENT DOCUMENTS

| | | |
|---|---|---|
| 2017/0271370 A1 | 9/2017 | Wang et al. |
| 2018/0081470 A1 | 3/2018 | Li et al. |

FOREIGN PATENT DOCUMENTS

| | | |
|---|---|---|
| CN | 105161505 A | 12/2015 |
| CN | 105717690 A | 6/2016 |
| CN | 108511394 A | 9/2018 |

OTHER PUBLICATIONS

International search report of PCT application No. PCT/CN2018/116850 dated Feb. 28, 2019.

First office action of Chinese application No. 201810258985.6 dated Mar. 4, 2020.

\* cited by examiner

ARRAY SUBSTRATE AND MANUFACTURING METHOD THEREOF, DISPLAY PANEL, AND DISPLAY DEVICE

CROSS-REFERENCE TO RELATED APPLICATION

This application is a 371 of PCT Patent Application Serial No. PCT/CN2018/116850, filed on Nov. 22, 2018, which claims priority to Chinese Patent Application No. 201810258985.6, filed on Mar. 27, 2018 and entitled "ARRAY SUBSTRATE AND MANUFACTURING METHOD THEREOF, AND DISPLAY DEVICE", the entire contents of which are incorporated herein by reference.

TECHNICAL FIELD

The present disclosure relates the field of display technology, and particularly relates to an array substrate and a manufacturing method thereof, a display panel, and a display device.

BACKGROUND

The array substrate includes a base substrate and a gate metal pattern, a gate insulating layer, an active layer pattern, a first electrode pattern, a source-drain metal pattern, a first passivation layer and a second electrode pattern which are stacked on the base substrate.

In related arts, the array substrate is generally prepared by using a 6-time patterning process. The specific process includes: forming the gate electrode metal layer on the base substrate, and forming the gate metal pattern by a single patterning process. The gate metal pattern includes a gate electrode and a signal line. The signal line is in a peripheral area around a display area of the array substrate. The gate insulating layer is formed on the base substrate on which the gate metal pattern is formed. An active layer is formed on the base substrate on which the gate insulating layer is formed, and the active layer pattern is formed in a channel area by a single patterning process. A first electrode layer is formed on the base substrate on which the active layer pattern is formed, and a first electrode pattern is formed by a single patterning process. A source-drain electrode metal layer is formed on the base substrate on which the first electrode pattern is formed, and a source-drain metal pattern is formed by the single patterning process. The first passivation layer is formed on the base substrate on which the source-drain metal pattern is formed. A via hole penetrating the first passivation layer and the gate insulating layer is formed by a single patterning process. The orthogonal projection of the via hole on the base substrate and the orthogonal projection of the signal line on the base substrate have an overlapping area. A second electrode layer is formed on the base substrate on which the first passivation layer is formed, and a second electrode pattern is formed by a single patterning process. The second electrode pattern includes an electrode lead wire in the peripheral area around the display area, and the electrode lead wire is electrically connected to the signal line through the via hole, such that the electrode lead wire can transmit a signal to the signal line. The first electrode pattern and the second electrode pattern are respectively one of a pixel electrode pattern and a common electrode pattern.

SUMMARY

The present disclosure provides an array substrate and a manufacturing method thereof, a display panel, and a display device.

In an aspect, there is provided an array substrate, which comprises a display area and a peripheral area which is around the display area. The array substrate comprises:

a base substrate, and a gate metal pattern, a gate insulating layer and a source-drain metal pattern which are sequentially disposed on the base substrate;

wherein the gate metal pattern comprises a signal line and a gate electrode, the signal line is in the peripheral area, the gate insulating layer is provided with a first via hole penetrating the gate insulating layer, an orthogonal projection of the first via hole on the base substrate and an orthogonal projection of the signal line on the base substrate have an overlapping area, the source-drain metal pattern comprises a source-drain electrode wire, the source-drain electrode wire is electrically connected to the signal line through the first via hole, and one surface of a portion of the source-drain electrode wire in the peripheral area near the base substrate is in contact with the gate insulating layer.

Optionally, the array substrate further comprises a first passivation layer and a first electrode pattern, the first passivation layer is at a side of the source-drain metal pattern away from the base substrate, and the first electrode pattern is at a side of the first passivation layer away from the base substrate; and the first electrode pattern comprises an electrode lead wire in the peripheral area, the first passivation layer is provided with a second via hole penetrating the first passivation layer, an orthogonal projection of the second via hole on the base substrate and an orthogonal projection of the first via hole on the base substrate have no overlapping area, and the source-drain electrode wire is electrically connected to the electrode lead wire through the second via hole.

Optionally, the first electrode pattern further comprises an electrode protection sub-pattern in the peripheral area, the electrode protection sub-pattern and the electrode lead wire are insulated from each other, the source-drain metal pattern further comprises a source electrode, a drain electrode and a source-drain signal transmission line, the gate metal pattern further comprises a gate signal transmission line, the signal line transmits a signal to one of the source electrode and the drain electrode via the source-drain signal transmission line, and the signal line transmits a signal to the gate electrode via the gate signal transmission line;

wherein an orthogonal projection of the electrode protection sub-pattern on the base substrate covers an orthogonal projection of the source-drain signal transmission line in the peripheral area on the base substrate and an orthogonal projection of the gate signal transmission line in the peripheral area on the base substrate.

Optionally, the array substrate further comprises a second electrode pattern, the second electrode pattern is between the gate insulating layer and the first passivation layer, and an orthogonal projection of the second electrode pattern on the base substrate and an orthogonal projection of the first electrode pattern on the base substrate have a non-overlapping area.

Optionally, the first electrode pattern and the second electrode pattern are respectively one of a pixel electrode pattern and a common electrode pattern.

Optionally, the array substrate further comprises an active layer pattern, the active layer pattern is between the gate insulating layer and the source-drain metal pattern, and the active layer pattern is in the display area.

Optionally, the array substrate further comprises an active layer pattern and a second passivation layer, the active layer pattern is between the base substrate and the gate metal pattern, the second passivation layer is between the active layer pattern and the gate metal pattern, and the active layer pattern is in the display area.

Optionally, a preparing material of the gate metal pattern comprises aluminumn, tantalum, or molybdenum.

Optionally, a preparing material of the source-drain metal pattern comprises aluminum, tantalum, or molybdenum.

Optionally, a preparing material of the first passivation layer comprises silicon dioxide or silicon nitride.

Optionally, the array substrate further comprises a second electrode pattern and and an active layer;

the second electrode pattern is between the gate insulating layer and the first passivation layer, and an orthogonal projection of the second electrode pattern on the base substrate and an orthogonal projection of the first electrode pattern on the base substrate have a non-overlapping area;

the active layer pattern is between the gate insulating layer and the source-drain metal pattern, the active layer pattern is in the display area;

the first electrode pattern and the second electrode pattern are respectively one of a pixel electrode pattern and a common electrode pattern;

a preparing material of the gate metal pattern comprises at least one of aluminum, tantalum, and molybdenum;

a preparing material of the source-drain metal pattern comprises at least one of aluminum, tantalum, and molybdenum.

In another aspect, there is provided a method for manufacturing an array substrate. The array substrate comprises a display area and a peripheral area around the display area, and the method comprises:

providing a base substrate;

sequentially forming a gate metal pattern and a gate insulating layer on the base substrate, wherein the gate metal pattern comprises a signal line and a gate electrode, and the signal line is in the peripheral area;

forming a first via hole penetrating the gate insulating layer by a patterning process, wherein an orthogonal projection of the first via hole on the base substrate and an orthogonal projection of the signal line on the base substrate have an overlapping area; and forming a source-drain metal pattern on the base substrate, wherein the source-drain metal pattern comprises a source-drain electrode wire, the source-drain electrode wire is electrically connected to the signal line through the first via hole, and one surface of a portion of the source-drain electrode wire in the peripheral area near the base substrate is in contact with the gate insulating layer.

Optionally, after sequentially forming a gate metal pattern and a gate insulating layer on the base substrate, the method further comprises:

forming an active layer on the base substrate on which the gate insulating layer is formed; and forming a first via hole penetrating the gate insulating layer by a patterning process comprises:

forming the: first via hole penetrating the active layer and the gate insulating layer by a patterning process, and forming an active layer pattern by the patterning process, and the active layer pattern is in the display area.

Optionally, forming the first via hole penetrating the active layer and the gate insulating layer by a patterning process, and forming an active layer pattern by a patterning process, comprises:

forming a photoresist layer on one surface of the active layer away from the base substrate;

exposing the photoresist layer by using a half tone mask from one side of the photoresist layer away from the base substrate;

developing the photoresist layer after being exposed to form a photoresist pattern, wherein the photoresist pattern comprises a first sub-pattern and a second sub-pattern, the first sub-pattern is at a side of a channel area away from the base substrate, and a thickness of the first sub-pattern is greater than a thickness of the second sub-pattern;

etching the active layer and the gate insulating layer by an etching process to form the first via hole in a target area, wherein the target area comprises an area other than an area covered by an orthogonal projection of the photoresist pattern on the active layer;

removing the second sub-pattern by an asking process, and etching the active layer by a dry etching process, to form the active layer pattern; and removing the first sub-pattern.

Optionally, the half tone mask comprises a first light-transmitting area, a second light-transmitting area, and a light-shielding area, and a transmittance of the first light-transmitting area is greater than a transmittance of the second light-transmitting area;

exposing the photoresist layer by using a half tone mask comprises:

exposing the photoresist layer by using the half tone mask, such that the photoresist layer after being exposed forms a first exposure area corresponding to the first light-transmitting area, a second exposure area corresponding to the second light-transmitting area, and a non-exposure area corresponding to the light-shielding area; and developing the photoresist layer after being exposed to form a photoresist pattern, comprises:

developing the photoresist layer after being exposed, to remove the photoresist in the first exposure area, and to enable the second exposure area to form the second sub-pattern, and the non-exposure area to form the first sub-pattern.

Optionally, etching the active layer and the gate insulating layer by an etching process comprises:

etching the active layer and the gate insulating layer by a dry etching process.

Optionally, after forming a source-drain metal pattern on the base substrate on which the active layer pattern is formed, the method further comprises:

forming a first passivation layer on the base substrate on which the source-drain metal pattern is formed;

forming a second via hole penetrating the first passivation layer in the first passivation layer by a patterning process, wherein an orthogonal projection of the second via hole on the base substrate and an orthogonal projection of the first via hole on the base substrate have no overlapping area; and forming a first electrode pattern on the base substrate on which the first passivation layer is formed, wherein the first electrode pattern comprises an electrode lead wire in the peripheral area, and the electrode lead wire is electrically connected to the source-drain electrode wire through the second via hole.

Optionally, after sequentially forming the gate metal pattern, the gate insulating layer and the active layer on the base substrate, the method further comprises:

forming a second electrode pattern on the base substrate on which the active layer pattern is formed by a patterning process; and forming a first passivation layer on the base substrate on which the source-drain metal pattern is formed comprises:

forming the first passivation layer on the base substrate on which the second electrode pattern and the source-drain metal pattern are formed.

Optionally, before sequentially forming a gate metal pattern and a gate insulating layer on the base substrate, the method further comprises:

forming an active layer pattern on the base substrate; and
forming a second passivation layer on the base substrate on which the active layer pattern is formed.

In still another aspect, there is provided a display panel, comprising: any of the array substrates according to above aspect.

Optionally, the display panel further comprises a color filter substrate and a liquid crystal layer which is between the array substrate and the color filter substrate.

In still yet another aspect, there is provided a display device, comprising: any of the array substrates according to above aspect.

DETAILED DESCRIPTION

The present disclosure will be described in further detail with reference to the accompanying drawings, to present the objects, technical solutions, and advantages of the present disclosure clearer.

Figure 1:
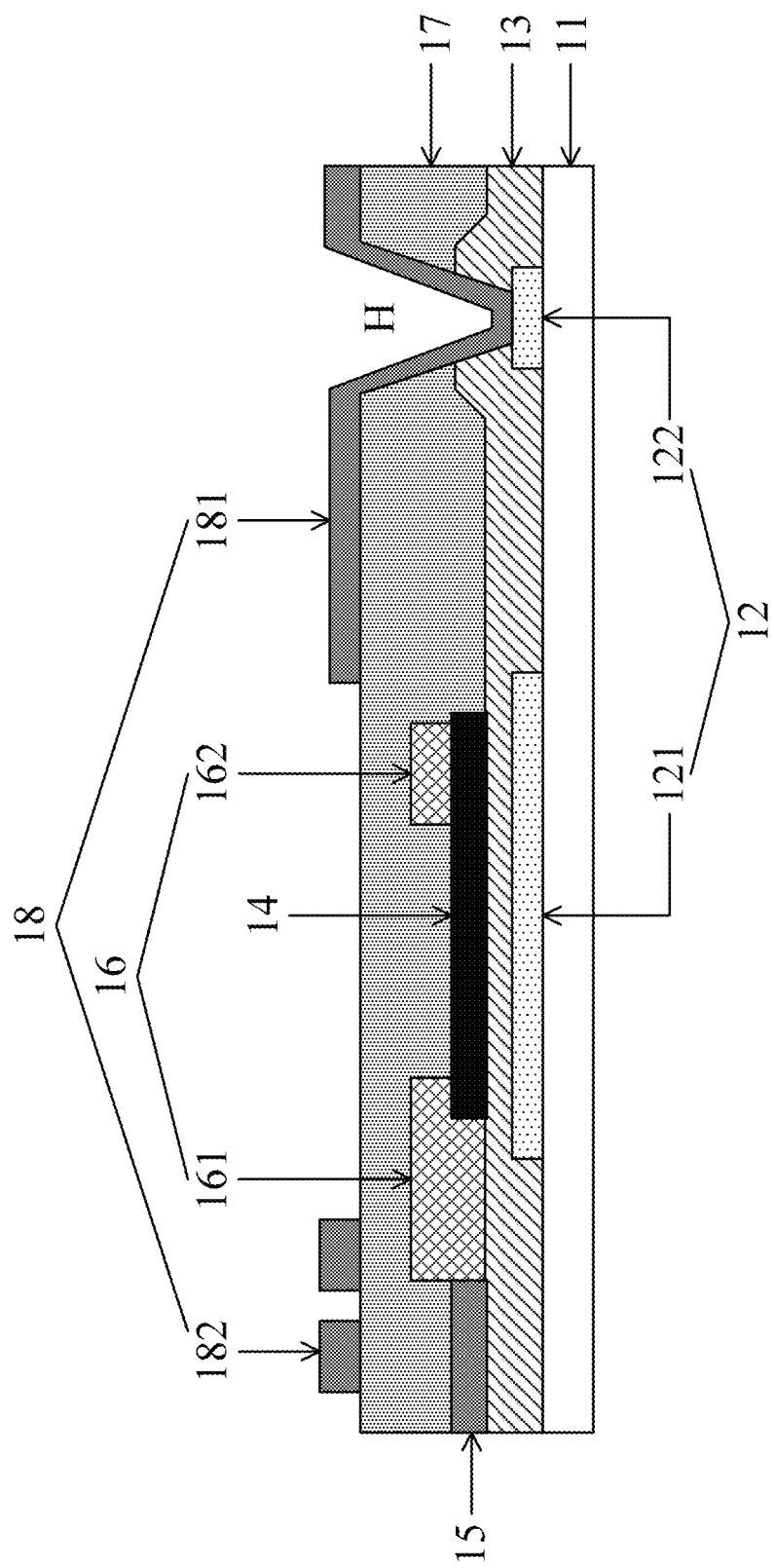
FIG. 1 is a schematic structural diagram of an array substrate according to related arts.

The liquid crystal display device includes an array substrate, a color filter substrate, and a liquid crystal layer between the array substrate and the color filter substrate. FIG. 1 is a schematic structural diagram of an array substrate according to related arts. The array substrate is formed by a 6-time patterning process (also referred to as a 6-mask process). As shown in FIG. 1, the array substrate includes a base substrate 11, and a gate metal pattern 12, a gate insulating layer 13, an active layer pattern 14, a first electrode pattern 15, a source-drain metal pattern 16, a first passivation layer 17, and a second electrode pattern 18 which are sequentially disposed on the base substrate 11. The gate metal pattern 12 includes a gate electrode 121 in a display area of the array substrate and a signal line 122 in a peripheral area around the display area. The source-drain metal pattern 16 includes a source electrode 161 and a drain electrode 162. A transfer via hole H is disposed directly above the signal line 122. The second electrode pattern 18 includes an electrode lead wire 181 in the peripheral area and an electrode 182 in the display area, and the electrode lead wire 181 is electrically connected to the signal line 122 by the via hole H. The first electrode pattern and the second electrode pattern are respectively one of a pixel electrode pattern and a common electrode pattern.

However, on one hand, when the via hole above the signal line is formed, the metal loss of the signal line is relatively large due to factors such as process fluctuation or a too small etching area. On the other hand, as shown in FIG. 1, in related arts, the signal line is only covered by the electrode lead wire, the electrode pattern is usually made of Indium tin oxide (ITO), and the compactness of an ITO film layer is relatively low, and the water vapor in the environment easily corrodes the signal line through the ITO film layer, thereby affecting the signal transmission performance of the signal line and resulting in relatively low reliability of the array substrate.

Figure 2:
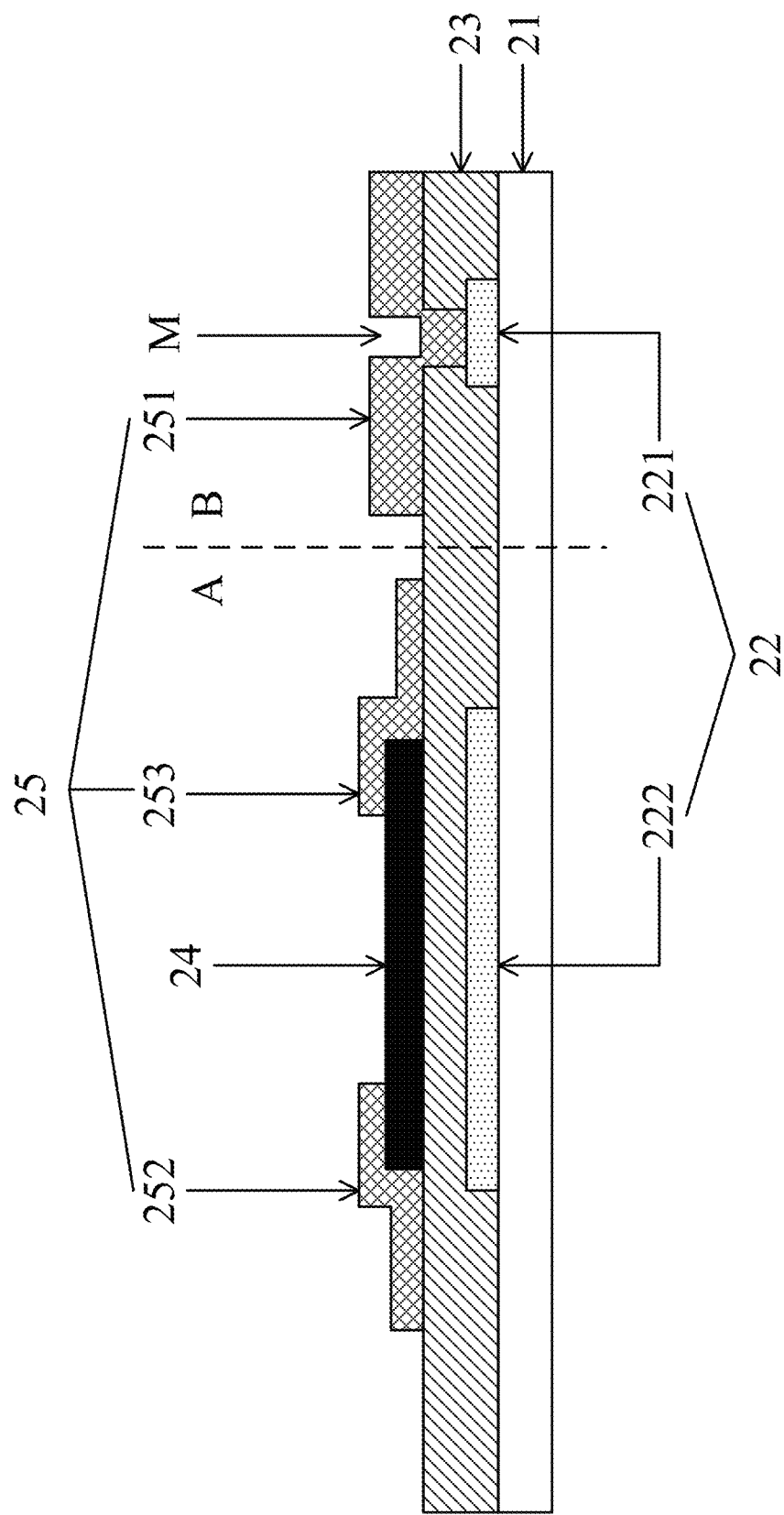
FIG. 2 is a schematic structural diagram of an array substrate according to an embodiment of the present disclosure.

FIG. 2 is a schematic structural diagram of an array substrate according to an embodiment of the present disclosure. As shown in FIG. 2, the array substrate includes a display area A and a peripheral area B which is around the display area A. The array substrate may include following structures.

A base substrate 21, and a gate metal pattern 22, a gate insulating layer 23 and a source-drain metal pattern 25 which are sequentially disposed on the base substrate 21.

Referring to FIG. 2, the gate metal pattern 22 includes a signal line 221 and a gate electrode 222, and the signal line 221 is in the peripheral area B. The gate insulating layer 23 is provided with a first via hole M penetrating the gate insulating layer 23, and the orthogonal projection of the first via hole M on the base substrate 21 and the orthogonal projection of the signal line 221 on the base substrate 21 have an overlapping area. The source-drain metal pattern 25 includes a source-drain electrode wire 251, and the source-drain electrode wire 251 is electrically connected to the signal line 221 through the first via hole M. The source-drain metal pattern 25 further includes a source electrode 252 and a drain electrode 253.

Figure 3:
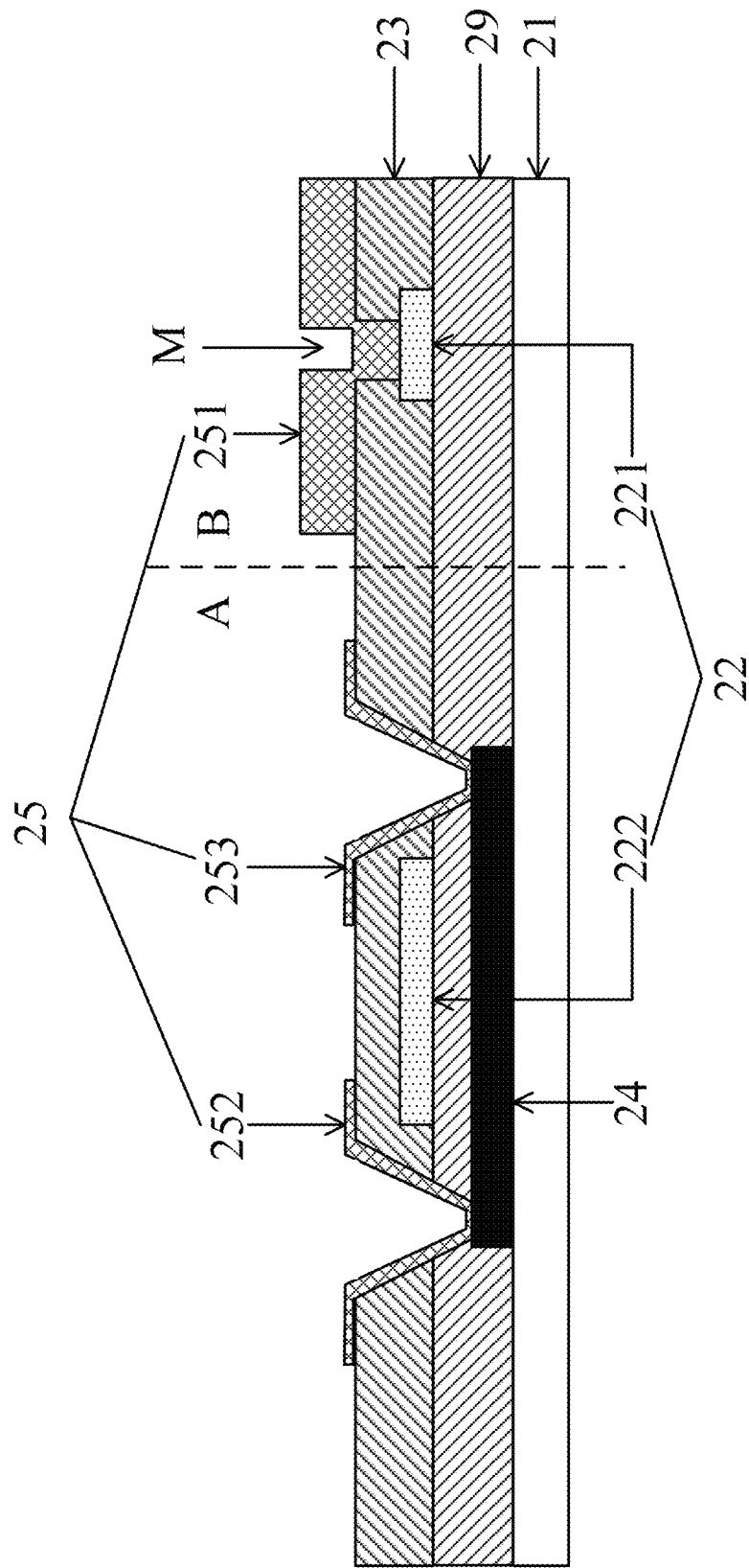
FIG. 3 is a schematic structural diagram of another array substrate according to an embodiment of the present disclosure.

The array substrate provided by the embodiment of the present disclosure may be a bottom gate structure or a top gate structure. When the array substrate is a bottom gate structure, referring to FIG. 2, the array substrate may further include an active layer pattern 24 between the gate insulating layer 23 and the source-drain metal pattern 25. FIG. 3 is a schematic structural diagram of another array substrate according to an embodiment of the present disclosure. When the array substrate is a top gate structure, referring to FIG. 3, the array substrate further includes an active layer pattern 24 and a second passivation layer 29. The active layer pattern 24 is between the base substrate 21 and the gate metal pattern 22. The second passivation layer 29 is between the active layer pattern 24 and the gate metal pattern 22. The following embodiments of the present disclosure are described by taking the bottom gate structure as an example of the array substrate.

Referring to FIG. 2 and FIG. 3, it is shown that the active layer pattern 24 is in the display area A. The orthogonal projection of the active layer pattern 24 on the base substrate 21, the orthogonal projection of a portion of the source-drain electrode wire 251 in the peripheral area B on the base substrate 21 and the orthogonal projection of the signal line 221 on the base substrate 21 have no overlapping area. Thus, one surface of a portion of the source-drain electrode wire 251 in the peripheral area B near the base substrate 21 may be in contact with the gate insulating layer 23.

When the active layer pattern 24 is in the peripheral area B, the source-drain electrode wire 251 need to connect the signal line 221 through a via hole in the active layer pattern 24 and the first via hole M in the gate insulating layer 23, which lead to a relatively large depth of the via hole that the source-drain electrode wire 251 need to pass through when connected to the signal line 221, thereby increasing the risk of breaking of source-drain electrode wire 251 where the source-drain electrode wire 251 is connected to the signal line 221 in the via hole.

However, according to the embodiment of the present disclosure, the the active layer pattern 24 is not in the peripheral area B, so the source-drain electrode wire 251 may be directly connected to the signal line 221 through the first via hole M in the gate insulating layer 23. Since the depth of the via hole that the source-drain electrode wire 251 need to pass through when connected to the signal line 221 is relatively small, the risk of breaking of source-drain electrode wire 251 where the source-drain electrode wire 251 is connected to the signal line 221 in the via hole is effectively decreased.

And, since the active layer pattern 24 is made of a semiconductor material, when the source-drain electrode wire 251 and the signal line 221 are electrochemically etched under the attack of water vapor and oxygen, and electrons in the semiconductor material moves between the source-drain electrode wire 251 and the signal line 221 under the action of the potential, the corrosion of the source-drain electrode wire 251 and the signal line 221 is increased. Thus, according to the array substrate provided by the embodiment of the present disclosure, the active layer pattern 24 is not in the peripheral area B, which may prevent the source-drain electrode wire 251 from being contact with the active layer pattern 24, thereby reducing the electrochemical reaction between the source-drain electrode wire 251 and the signal line 221, and preventing the corrosion of the source-drain electrode wire 251 and the signal line 221 from increasing.

Optionally, a preparing material of the gate metal pattern includes at least one of aluminum (Al), germanium (Nd), and molybdenum (Mo). A preparing material of the source-drain metal pattern includes at least one of aluminum, germanium, and molybdenum.

In summary, according to the array substrate provided by the embodiment of the present disclosure, the gate insulating layer is provided with the first via hole penetrating the gate insulating layer, and the orthogonal projection of the first via hole on the base substrate and the orthogonal projection of the signal line in the peripheral area on the base substrate have an overlapping area. The source-drain metal pattern is disposed on one side of the gate insulating layer provided with the first via hole away from the base substrate, such that the source-drain electrode wire in the source-drain metal pattern is electrically connected to the signal line through the first via hole, i.e., the source-drain electrode metal layer is disposed on one side of the signal line away from the base substrate. Due to the relatively high compactness of the source-drain electrode metal layer, the water vapor in the environment does not easily corrode the signal line through the source-drain electrode metal layer, thereby ensuring the signal transmission performance of the signal line and improving the reliability of the array substrate.

Figure 4:
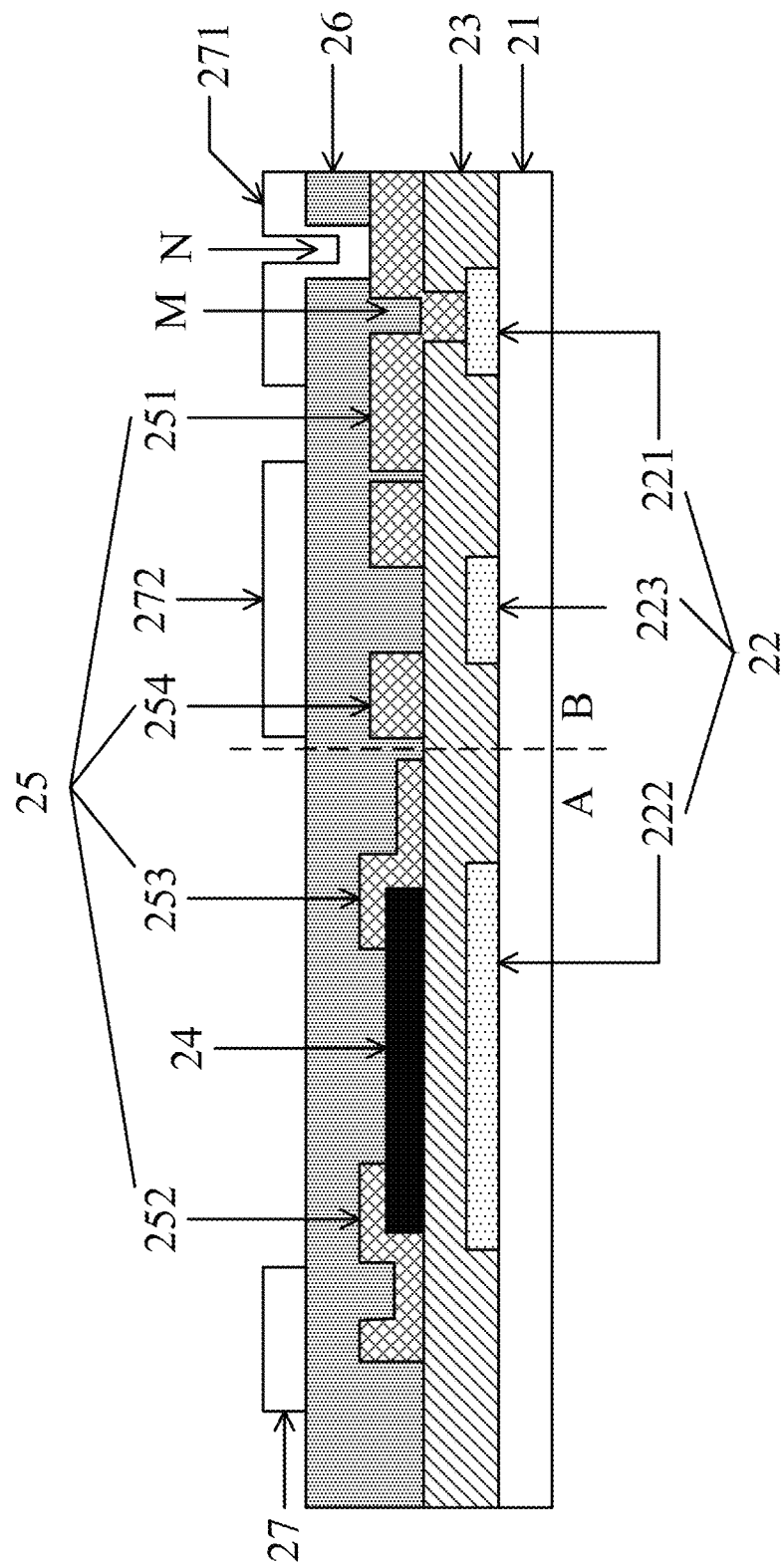
FIG. 4 is a schematic structural diagram of yet another array substrate according to an embodiment of the present disclosure.

Optionally, FIG. 4 is a schematic structural diagram of yet another array substrate according to the embodiment of the present disclosure. As shown in FIG. 4, the array substrate further includes a first passivation layer 26 and a first electrode pattern 27. The first passivation layer 26 is at one side of the source-drain metal pattern 25 away from the base substrate 21. The first electrode pattern 27 is at one side of the first passivation layer 26 away from the base substrate 21.

Referring to FIG. 4, the first electrode pattern 27 includes an electrode lead wire 271 in the peripheral area B. The first passivation layer 26 is provided with a second via hole N penetrating the first passivation layer 26. The orthogonal projection of the second via hole N on the base substrate 21 and the orthogonal projection of the first via hole M on the base substrate 21 have no overlapping area, and the source-drain electrode wire 251 is electrically connected to the electrode lead wire 271 through the second via hole N.

Optionally, a preparing material of the first passivation layer includes at least one of silicon dioxide or silicon nitride.

It should be noted that the signal line is electrically connected to the electrode lead wire by the source-drain electrode wire. After integrated circuit bonding (IC bonding) and flexible printed circuit bonding (FPC bonding) are finished, the IC chip can transmit a signal to the signal line by the electrode lead wire. The first passivation layer is disposed on one side of the source-drain metal pattern away from the base substrate, and the orthogonal projection of the second via hole disposed in the first passivation layer on the base substrate and the orthogonal projection of the first via hole disposed in the gate insulating layer on the substrate have no overlapping area, that is, the first passivation layer is further disposed on one side of the source-drain electrode wire in the first via hole away from the signal line, and then the source-drain electrode metal layer and the first passivation layer are sequentially disposed on one side of the signal line away from the base substrate. Since the first passivation layer has relatively high compactness, the water vapor in the environment can be further isolated to protect the signal line from corrosion.

Optionally, as shown in FIG. 4, the first electrode pattern 27 may further include an electrode protection sub-pattern 272 in the peripheral area B. The electrode protection sub-pattern 272 is insulated from the electrode lead wire 271, that is, the electrode protection sub-pattern 272 and the electrode lead wire 271 are insulated from each other. The source-drain metal pattern 25 further includes a source-drain signal transmission line 254, and the gate metal pattern 22 further includes a gate signal transmission line 223.

The signal line 221 transmits a signal to one of the source electrode 252 and the drain electrode 253 via the source-drain signal transmission line 254, and the signal line 221 transmits a signal to the gate electrode 222 via the gate signal transmission line 223. The gate signal transmission line 233 is electrically connected to the gate electrode 222 and the signal line 221, respectively (the connection relationship is not shown), and the source-drain signal transmission line 254 may include a source signal transmission line and a drain signal transmission line. The source signal transmission line is electrically connected to the source electrode 252 and the signal line 221, respectively (the connection relationship is not shown), and the signal line 221 transmits a signal to the source electrode 252 via the source signal transmission line. The drain signal transmission line is electrically connected to the drain electrode 253 and the signal line 221, respectively (not shown), and the signal line 221 transmits a signal to the drain electrode 253 via the drain signal transmission line.

The orthogonal projection of the electrode protection sub-pattern 272 on the base substrate 21 covers the orthogonal projection of the source-drain signal transmission line 254 in the peripheral area B on the base substrate 21 and the orthogonal projection of the gate signal transmission line 223 in the peripheral area B on the base substrate 21.

It should be noted that the first passivation layer is disposed on one side of the source-drain signal transmission line and the gate signal transmission line away from the base substrate, and the first passivation layer can play a role of isolating the air. In order to prevent the first passivation layer from being scratched which may lead to corrosion of the signal transmission line, an electrode protection sub-pattern may be disposed on one side of the first passivation layer away from the base substrate to protect the first passivation layer. Since the orthogonal projection of the electrode protection sub-pattern covers the orthogonal projection of the source-drain signal transmission line and the orthogonal projection of the gate signal transmission line, the electrode protection sub-pattern may play a role of protecting the signal transmission line.

Figure 5:
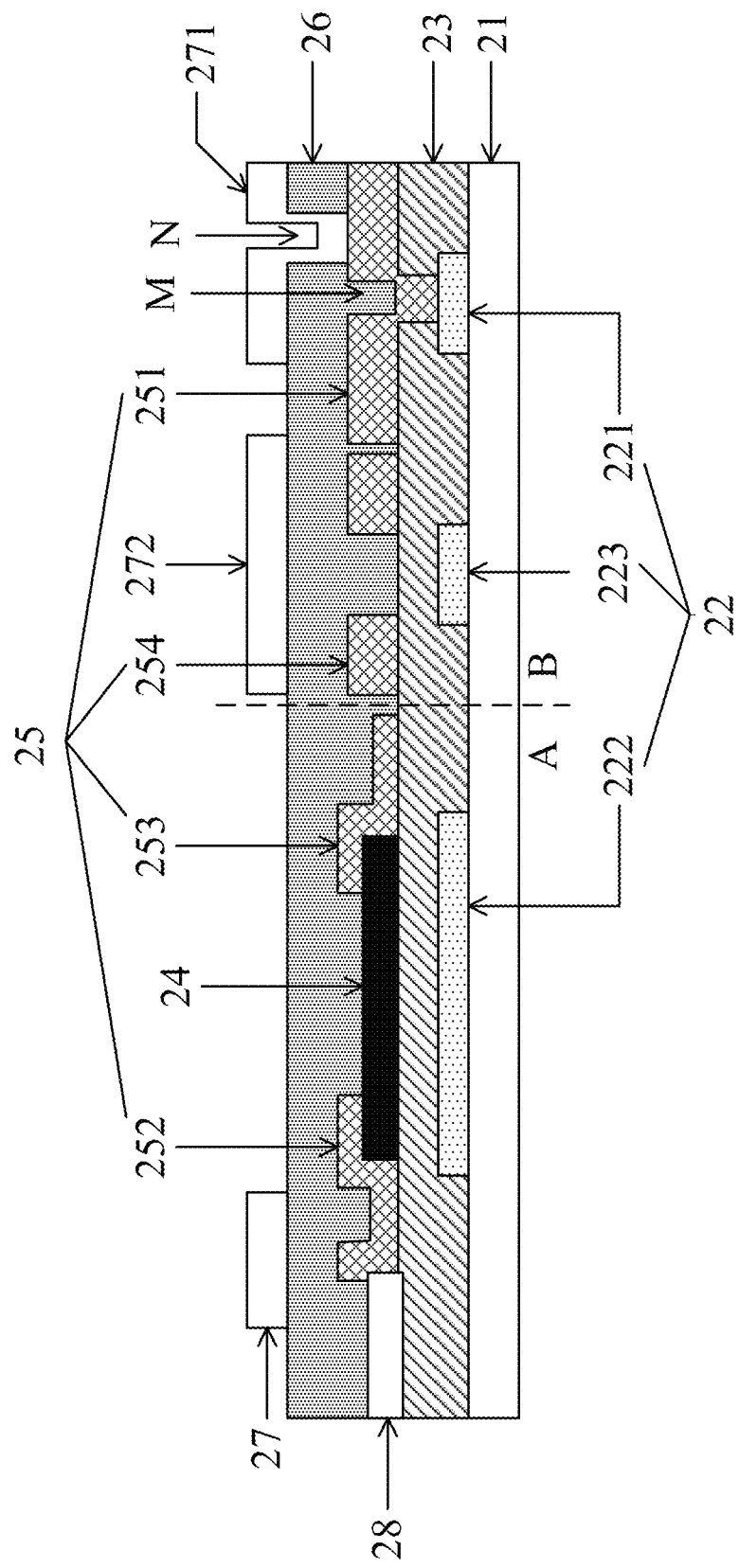
FIG. 5 is a schematic structural diagram of still a further array substrate according to an embodiment of the present disclosure.

Optionally, FIG. 5 is a schematic structural diagram of still a further array substrate provided by an embodiment of the present disclosure. As shown in FIG. 5, the array substrate may further include a second electrode pattern 28. The second electrode pattern 28 is between the gate insulating layer 23 and the first passivation layer 26. The orthogonal projection of the second electrode pattern 28 on the base substrate and the orthogonal projection of the first electrode pattern 27 on the base substrate have a non-overlapping area, so that it can be realized to control the deflection of a liquid crystal layer at one side of the first electrode pattern 27 away from the base substrate by controlling the electric field generated by the first electrode pattern 27 and the second electrode pattern 28.

The first electrode pattern 27 and the second electrode pattern 28 are respectively one of a pixel electrode pattern and a common electrode pattern. That is, the first electrode pattern 27 is the pixel electrode pattern, and the second electrode pattern 28 is the common electrode pattern. Or, the first electrode pattern 27 is the common electrode pattern, and the second electrode pattern 28 is the pixel electrode pattern.

It should be noted that the pixel electrode pattern is electrically connected to the source electrode or the drain electrode. For example, in the array substrate as shown in FIG. 5, the second electrode pattern 28 is electrically connected to the source electrode 252, that is, the second electrode pattern 28 is the pixel electrode pattern, and the first electrode pattern 27 is the common electrode pattern.

In summary, according to the array substrate provided by the embodiment of the present disclosure, the gate insulating layer is provided with the first via hole penetrating the gate insulating layer, and the orthogonal projection of the first via hole on the base substrate and the orthogonal projection of the signal line in the peripheral area on the base substrate have an overlapping area. The source-drain metal pattern is disposed on one side of the gate insulating layer provided with the first via hole away from the base substrate, such that the source-drain electrode wire in the source-drain metal pattern is electrically connected to the signal line by the first via hole, and the first passivation layer is further disposed on one side of the source-drain electrode wire in the first via hole away from the signal line, i.e., the source-drain metal pattern and the first passivation layer are disposed on one side of the signal line away from the base substrate in sequence. Due to the relatively high compactness of the source-drain electrode metal layer and the first passivation layer, the water vapor in the environment does not easily corrode the signal line through the source-drain electrode metal layer and the first passivation layer, thereby ensuring the signal transmission performance of the signal line and improving the reliability of the array substrate.

The embodiment of the present disclosure provides a display panel. The display panel may include an array substrate as shown in any of FIG. 2 to FIG. 5.

Optionally, the display panel provided by the embodiment of the present disclosure may be a liquid crystal display (LCD). The display panel may further include a color filter substrate, and a liquid crystal layer which is between the array substrate and the color filter substrate.

Exemplarily, when the structure of the array substrate is as shown in FIG. 4, the above liquid crystal display may be a twisted nematic (TN) type liquid crystal display. When the structure of the array substrate is as shown in FIG. 5, the above liquid crystal display may be an advanced super dimension switch (ADS) type liquid crystal display. The embodiment of the present disclosure does not limit the type of the liquid crystal display.

The embodiment of the present disclosure provides a display device. The display device may include a display provided by the above embodiment of the present disclosure.

Optionally, the above display device may be any product or component having a display function, such as a liquid crystal display device, electronic paper, a mobile phone, a tablet computer, a television, a display, a notebook computer, a digital photo frame, or a navigator.

In summary, according to the display device provided by the embodiment of the present disclosure, in the array substrate, the gate insulating layer is provided with the first via hole penetrating the gate insulating layer, and the orthogonal projection of the first via hole on the base substrate and the orthogonal projection of the signal line in the peripheral area on the base substrate have an overlapping area. The source-drain metal pattern is disposed on one side of the gate insulating layer provided with the first via hole away from the base substrate, such that the source-drain electrode wire in the source-drain metal pattern is electrically connected to the signal line by the first via hole, i.e., a source-drain electrode metal layer is disposed on one side of the signal line away from the base substrate. Due to the relatively high compactness of the source-drain electrode metal layer, the water vapor in the environment does not easily corrode the signal line through the source-drain electrode metal layer, thereby ensuring the signal transmission performance of the signal line, improving the reliability of the array substrate and the improving the stability of the display device.

Figure 6:
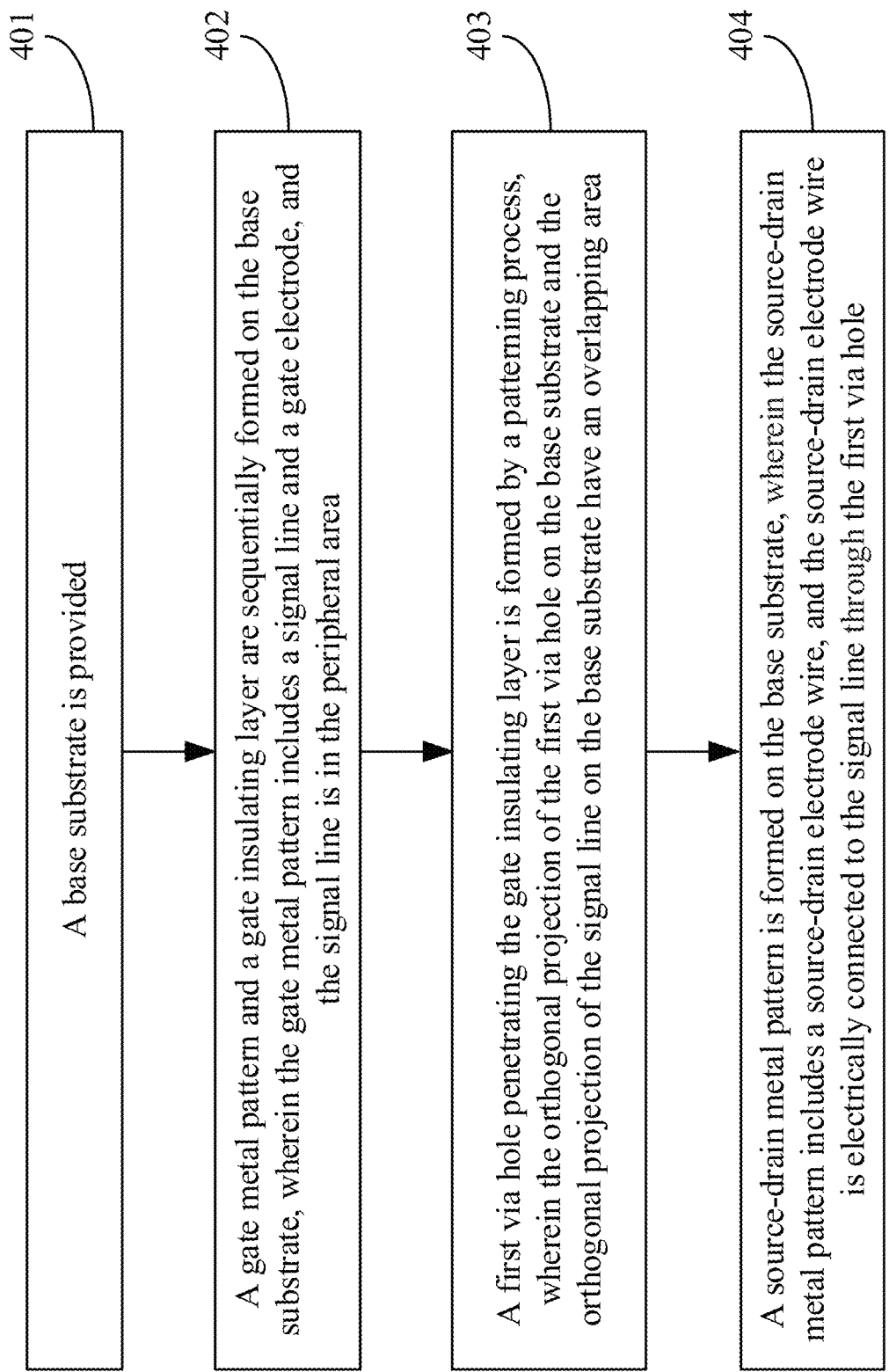
FIG. 6 is a flowchart of a method for manufacturing an array substrate according to an embodiment of the present disclosure.

FIG. 6 is a flowchart of a method for manufacturing an array substrate according to an embodiment of the present disclosure. The method may be used to manufacture the array substrate according to the embodiment of the present disclosure described above. The array substrate includes a display area and a peripheral area around the display area. As shown in FIG. 6, the method may include the following work process.

In step 401, a base substrate is provided.

In step 402, a gate metal pattern and a gate insulating layer are sequentially formed on the base substrate, wherein the gate metal pattern includes a signal line and a gate electrode, and the signal line is in the peripheral area.

In step 403, a first via hole penetrating the gate insulating layer is formed by a patterning process, wherein the orthogonal projection of the first via hole on the base substrate and the orthogonal projection of the signal line on the base substrate have an overlapping area.

In step 404, a source-drain metal pattern is formed on the base substrate, wherein the source-drain metal pattern includes a source-drain electrode wire, and the source-drain electrode wire is electrically connected to the signal line through the first via hole.

In summary, according to the method for manufacturing an array substrate provided by the embodiment of the present disclosure, the first via hole penetrating the active layer and the gate insulating layer is formed after the active layer is formed on the base substrate. When the source-drain metal pattern is formed, the source-drain electrode wire in the source-drain metal pattern can be electrically connected to the signal line by the first via to achieve signal transmission, that is, the source-drain electrode metal layer is formed in the first via hole at one side of the signal line away from the base substrate. Due to the relatively high compactness of the source-drain electrode metal layer, the water vapor in the environment does not easily corrode the signal line through the source-drain electrode metal layer, thereby ensuring the signal transmission performance of the signal line and improving the reliability of the array substrate.

Optionally, if the array substrate is a bottom gate structure, after step 402 is performed, the method further includes: forming an active layer on the base substrate on which the gate insulating layer is formed. The implementing process of step 403 includes: forming the first via hole penetrating the active layer and the gate insulating layer by a patterning process, and forming an active layer pattern by the patterning process. If the array substrate is a top gate structure, before step 402 is performed, the above method further includes: forming the active layer pattern on the base substrate; and forming a second passivation layer on the base substrate on which the active layer pattern is formed. The following embodiments of the present disclosure take the bottom gate structure as an example of the array substrate to describe the preparing process of the array substrate.

Figure 7:
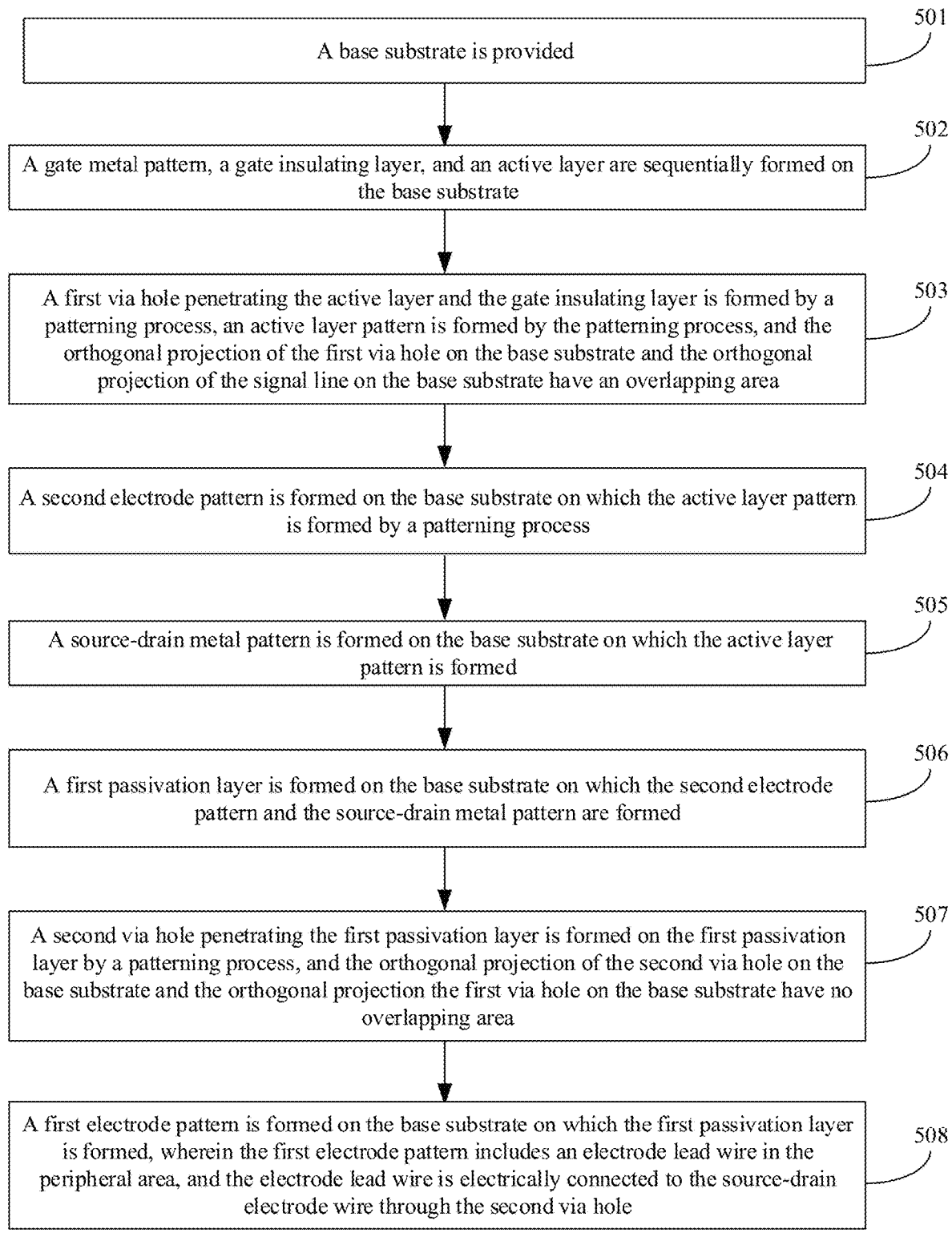
FIG. 7 is a flowchart of another method for manufacturing an array substrate according to an embodiment of the present disclosure.

FIG. 7 is a flowchart of another method for manufacturing an array substrate according to an embodiment of the present disclosure. As shown in FIG. 7, the method includes the following work process.

In step 501, a base substrate is provided.

Optionally, the base substrate may be made of a transparent material such as glass, a silicon wafer, quartz, or plastic.

In step 502, a gate metal pattern, a gate insulating layer, and an active layer are sequentially formed on the base substrate.

Figure 8:
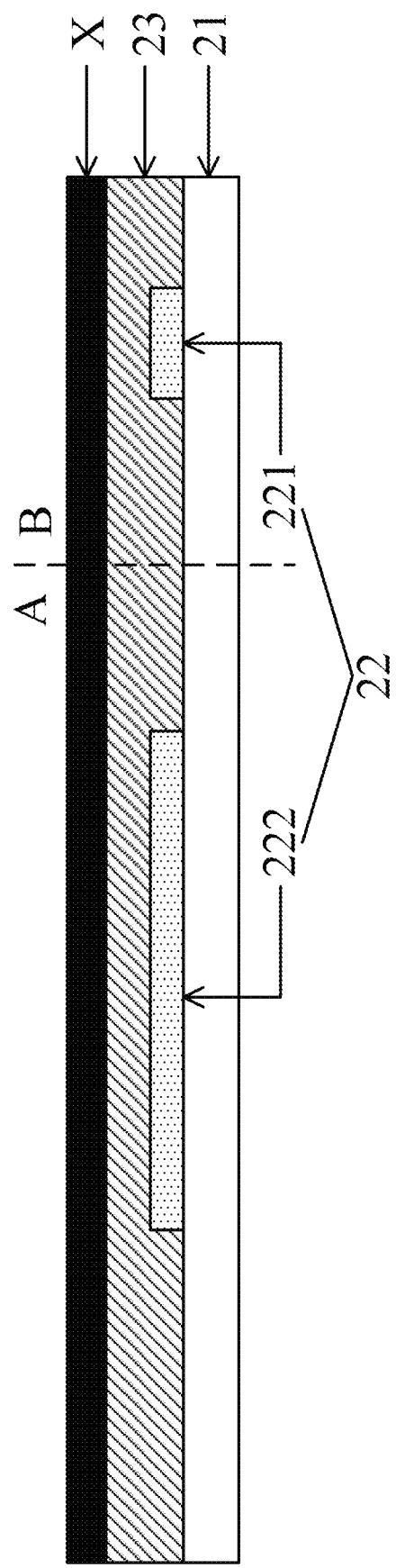
FIG. 8 is a partial structural diagram of an array substrate according to an embodiment of the present disclosure.

As shown in FIG. 8, the array substrate includes a display area A and a peripheral area B which is around the display area A. A gate metal pattern 22, a gate insulating layer 23, and an active layer X are sequentially formed on the base substrate 21. The gate metal pattern 22 includes a signal line 221 and a gate electrode 222, the signal line 221 is in the peripheral area B, and the gate electrode 222 is in the display area A.

Optionally, the preparing material of the gate metal pattern includes at least one of aluminum, germanium, and molybdenum. The gate electrode metal layer may be formed by deposition, and then the gate metal pattern is formed by the patterning process. The patterning process includes: photoresist coating, exposure, developing, etching, and photoresist peeling.

Optionally, the preparing material of the gate insulating layer includes at least one of silicon dioxide, silicon nitride, and aluminum oxide. For example, the gate insulating layer may be formed on the base substrate on which the gate metal pattern is formed by deposition. Optionally, the preparing material of the active layer includes at least one of indium gallium zinc oxide (IGZO), single crystal silicon (a-Si), low temperature poly-silicon (LTPS) or low temperature polycrystalline oxide (LTPO). For example, the active layer may be formed on the base substrate on which the gate insulating layer is formed by deposition.

In step 503, a first via hole penetrating the active layer and the gate insulating layer is formed by a patterning process, an active layer pattern is formed by the patterning process, and the orthogonal projection of the first via hole on the base substrate and the orthogonal projection of the signal line on the base substrate have an overlapping area.

Optionally, the active layer pattern is in the display area, so that the orthogonal projection of the active layer pattern on the base substrate and the orthogonal projection of the signal line on the base substrate have no overlapping area.

Figure 9:
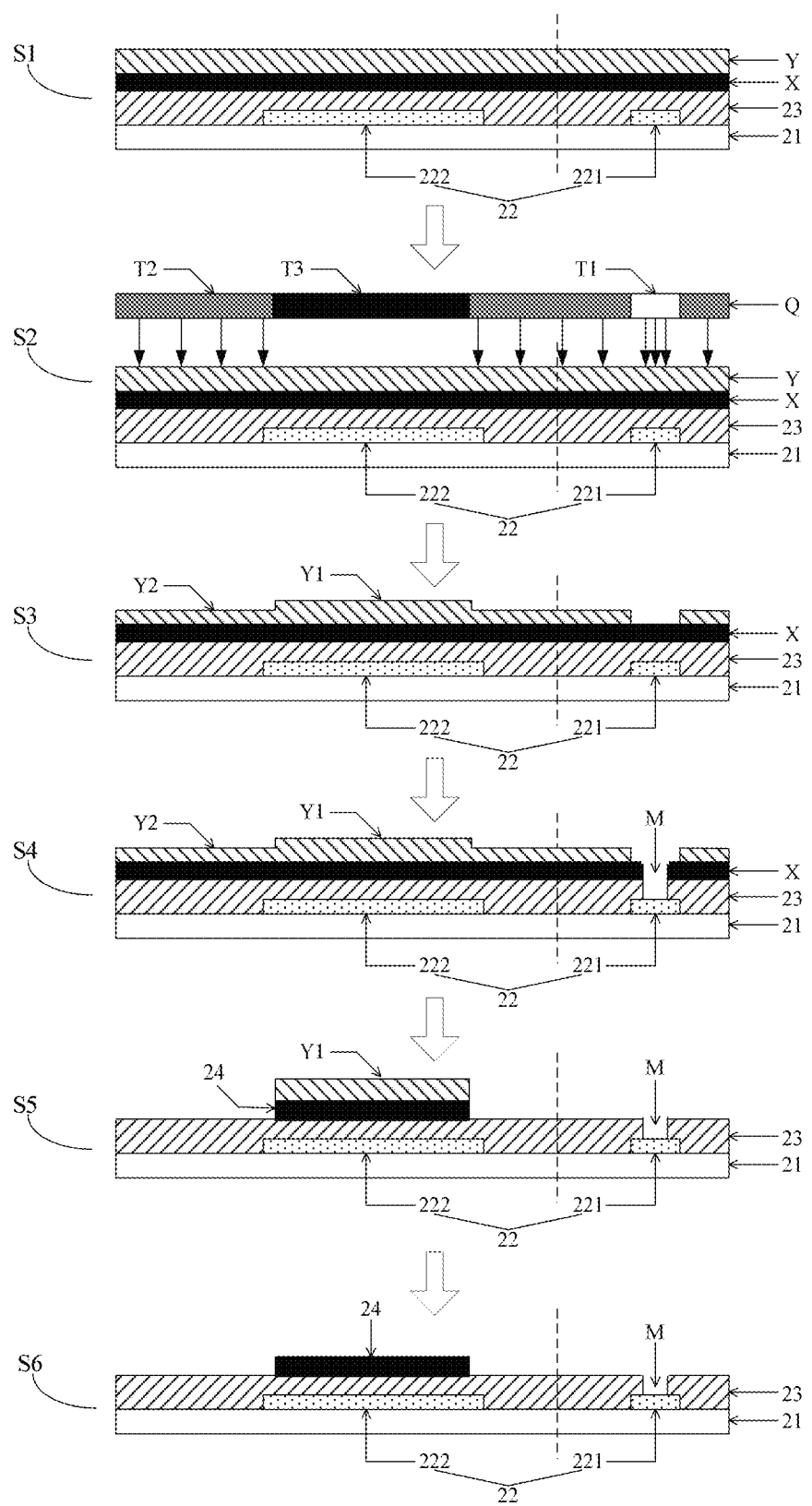
FIG. 9 is a process flowchart for forming a first via hole and an active layer pattern according to an embodiment of the present disclosure.

Optionally, FIG. 9 is a process flowchart of forming a first via hole penetrating an active layer and a gate insulating layer and an active layer pattern by a patterning process according to an embodiment of the present disclosure. As shown in FIG. 9, the process flow includes the following process.

In S1, a photoresist layer Y is formed on one surface of the active layer X away from the base substrate 21.

Optionally, the photoresist layer may be formed by coating on one surface of the active layer away from the base substrate, which is not limited.

In S2, the photoresist layer Y is exposed by using a half tone mask Q from one side of the photoresist layer Y away from the base substrate 21.

The half tone mask (HTM) Q includes a first light-transmitting area T1, a second light-transmitting area T2, and a light-shielding area T3, and a transmittance of the first light-transmitting area T1 is greater than a transmittance of the second light-transmitting area T2. As shown in FIG. 9, the size of the gray scale of the half tone mask represents the size of the transmittance, and the smaller gray scale indicates the greater transmittance, that is, the size of the gray scale of the half tone mask corresponds to the degree that the photoresist layer covered by the orthogonal projection of the half tone mask on the photoresist layer needs to be exposed, and the smaller gray scale indicates the greater degree that the photoresist layer needs to be exposed.

It should be noted that the photoresist layer Y is exposed by using the half tone mask Q, so that the exposed photoresist layer Y forms a first exposure area corresponding to the first light-transmitting area T1, a second exposure area corresponding to the second light-transmitting area T2, and a non-exposure area corresponding to the light-shielding area T3. The orthogonal projection of the first exposure area on the base substrate and the orthogonal projection of the signal line on the base substrate have an overlapping area. The orthogonal projection of the first exposure area on the gate insulating layer is the area in which the first via hole is to be formed on the gate insulating layer.

In S3, the exposed photoresist layer is developed to form a photoresist pattern, and the photoresist pattern includes a first sub-pattern Y1 and a second sub-pattern Y2. The first sub-pattern Y1 is directly above a channel area, and a thickness of the first sub-pattern Y1 is greater than a thickness of the second sub-pattern Y2.

Referring to S2, the exposed photoresist layer is developed to remove the photoresist in the first exposure area, the second exposure area is enabled to form the second sub-pattern Y2, and the non-exposure area is enabled to form the first sub-pattern Y1.

In S4, the active layer X and the gate insulating layer 23 are etched by an etching process to form a first via hole M in a target area, and the target area includes an area other than the area covered by the orthogonal projection of the photoresist pattern on the active layer. That is, the target area may be the area in which the orthogonal projection of the first exposure area on the active layer is.

Optionally, the active layer and the gate insulating layer may be etched by a dry etching process. The active layer may be prepared from an indium gallium zinc oxide, single crystal silicon, low temperature polysilicon or a low temperature polysilicon oxide. And the gate insulating layer may be made of silicon dioxide, silicon nitride or aluminum oxide. That is, the active layer and the gate insulating layer are both a non-metal layer, and the signal line is prepared from metal. The active layer and the gate insulating layer are etched by the dry etching process for nonmetals, thereby avoiding over-etching of the signal line, to reduce the damage to the signal line damage.

In S5, the second sub-pattern is removed by an ashing process, and the active layer is etched by a dry etching process to form the active layer pattern 24.

Optionally, the ashing rate may be controlled by adjusting an ambient gas pressure and the flow rate of ashing gas so as to remove the second sub-pattern. The first sub-pattern is not exposed, and the thickness of the first sub-pattern is relatively large, so the first sub-pattern may remain on the active layer. Further, the active layer pattern is formed by etching the portion of active layer which is not covered by the first sub-pattern by the dry etching process for nonmetals, thereby avoiding the damage to the signal line. Referring to FIG. 9, it is shown that the active layer pattern 24 is in the display area A. Thus, the orthogonal projection of the active layer pattern 24 on the base substrate 21 and the orthogonal projection of the signal line 221 on the base substrate 21 have no overlapping area.

In S6, the first sub-pattern is removed.

It should be noted that, in the above process, the positive photoresist is taken as an example for explanation. In the embodiment of the present disclosure, a negative photoresist may also be adopted, and the technological process may refer to the technological process adopting the positive photoresist, which is not excessively described by the embodiment of the present disclosure.

In step 504, a second electrode pattern is formed on the base substrate on which the active layer pattern is formed by a patterning process.

Optionally, the second electrode pattern may be made of indium tin oxide (ITO) or indium zinc oxide (IZO).

In step 505, a source-drain metal pattern is formed on the base substrate on which the active layer pattern is formed.

The source-drain metal pattern includes a source-drain electrode wire, and the source-drain electrode wire is electrically connected to the signal line through the first via hole. The source-drain metal pattern further includes a source electrode and a drain electrode in the display area.

Optionally, the source-drain metal pattern may be made of at least one of aluminum, tantalum, and molybdenum.

In the embodiment of the present disclosure, the active layer pattern is in the display area and is not in the peripheral area, so one surface of a portion of the source-drain electrode wire in the peripheral area near the base substrate may be directly in contact with the gate insulating layer, and may be connected to the signal line through the first via hole, thereby decreasing the depth of the via hole that the source-drain electrode wire need to pass through when connected to the signal line, and effectively decreasing the risk of breaking of source-drain electrode wire where the source-drain electrode wire is connected to the signal line in the via hole. Moreover, since that the source-drain electrode wire is contact with the active layer pattern is prevented, when the source-drain electrode wire and the signal line are electrochemically etched under the attack of water vapor and oxygen, the electrochemical reaction between the source-drain electrode wire and the signal line is prevented from being increased due to electrons, thereby preventing the corrosion of the source-drain electrode wire and the signal line from increasing.

In step 506, a first passivation layer is formed on the base substrate on which the second electrode pattern and the source-drain metal pattern are formed.

Optionally, the first passivation layer may be made of silicon dioxide or silicon nitride.

In step 507, a second via hole penetrating the first passivation layer is formed on the first passivation layer by a patterning process, and the orthogonal projection of the second via hole on the base substrate and the orthogonal projection the first via hole on the base substrate have no overlapping area.

In step 508, a first electrode pattern is formed on the base substrate on which the first passivation layer is formed, wherein the first electrode pattern includes an electrode lead wire in the peripheral area, and the electrode lead wire is electrically connected to the source-drain electrode wire through the second via hole.

Optionally, the first electrode pattern may be made of the ITO or IZO. It should be noted that the first electrode pattern and the second electrode pattern are respectively one of a pixel electrode pattern and a common electrode pattern, that is, the first electrode pattern is the pixel electrode pattern, and the second electrode pattern is the common electrode pattern, or the first electrode pattern is the common electrode pattern, and the second electrode pattern is the pixel electrode pattern.

For example, as shown in FIG. 4 or FIG. 5, the orthogonal projection of the second via hole N on the base substrate 21 and the orthogonal projection of the first via hole M on the base substrate 21 have no overlapping area, and the source-drain electrode wire 251 is electrically connected to the electrode lead wire 271 through the second via hole N. On one hand, the signal line is electrically connected to the electrode lead wire by the source-drain electrode wire. After IC bonding and FPC bonding are completed, the IC chip can transmit a signal to the signal line by the electrode lead wire. On the other hand, the orthogonal projection of the second via hole disposed in the first passivation layer on the base substrate and the orthogonal projection of the first via hole disposed in the gate insulating layer on the base substrate have no overlapping area, such that the first passivation layer is disposed directly above the source-drain electrode wire in the first via hole, to realize the protection on the signal line.

Optionally, the first electrode pattern may further include an electrode protection sub-pattern in the peripheral area, the electrode protection sub-pattern is insulated from the electrode lead wire, and the source-drain metal pattern further includes a source-drain signal transmission line. The gate metal pattern further includes a gate signal transmission line.

The signal line transmits a signal to one of the source electrode and the drain electrode via the source-drain signal transmission line, and the signal line transmits a signal to the gate electrode via the gate signal transmission line. The orthogonal projection of the electrode protection sub-pattern on the base substrate covers the orthogonal projection of the source-drain signal transmission line in the peripheral area on the base substrate, and the orthogonal projection of the gate signal transmission line in the peripheral area on the base substrate.

It should be noted that the first passivation layer is disposed on one side of the source-drain signal transmission line and the gate signal transmission line away from the base substrate, and the first passivation layer may play a role of isolating air. In order to prevent the first passivation layer from being scratched which may lead to corrosion of the signal transmission line, an electrode protection sub-pattern may be disposed on one side of the first passivation layer away from the base substrate to protect the first passivation layer, thereby further protecting the signal transmission line.

The method for manufacturing an array substrate provided by the embodiment of the present disclosure directly forms the first via hole penetrating the active layer and the gate insulating layer after forming the active layer, and then the source-drain electrode wire and the first passivation layer are formed in the first via hole. The anti-corrosion effect of the signal line is realized without increasing the mask process. Therefore, the process in the embodiment of the present disclosure is simple and relatively low in cost, and is convenient for realizing batch production of the array substrate.

It should be noted that the sequence of the steps of the method for manufacturing an array substrate provided by the embodiment of the present disclosure may be appropriately adjusted. For example, the sequence of step 504 and step 505 may be interchanged, and the steps may also be correspondingly increased or decreased according to the condition. For example, step 504 may not be performed, and any variable method that can be easily conceived by those skilled in the art within the technical scope of the present disclosure should be included in the scope of the present disclosure, and thus will not be excessively described in detail.

In summary, according to the method for manufacturing an array substrate according to the embodiment of the present disclosure, the first via hole penetrating the active layer and the gate insulating layer is formed after the active layer is formed on the base substrate. When the source-drain metal pattern is formed, the source-drain electrode wire in the source-drain metal pattern can be electrically connected to the signal line through the first via hole to achieve signal transmission. The first passivation layer is further formed on the base substrate on which the source-drain metal pattern is formed, that is, the source-drain metal pattern and the first passivation layer are formed in the first via hole at one side of the signal line away from the base substrate. Due to the relatively high compactness of the source-drain electrode metal layer and the first passivation layer, the water vapor in the environment does not easily corrode the signal line through the source-drain electrode metal layer and the first passivation layer, thereby ensuring the signal transmission performance of the signal line and improving the reliability of the array substrate.

The foregoing descriptions are only optional embodiments of the present disclosure, and are not intended to limit the present disclosure. Within the spirit and principles of the present disclosure, any modifications, equivalent substitutions, improvements, etc., are within the protection scope of the present disclosure.

The invention claimed is:

1. An array substrate, comprising a display area and a peripheral area which is around the display area, wherein the array substrate comprises:
a base substrate, and a gate metal pattern, a gate insulating layer and a source-drain metal pattern which are sequentially disposed on the base substrate;
wherein the gate metal pattern comprises a signal line and a gate electrode, the signal line is in the peripheral area, the gate insulating layer is provided with a first via hole penetrating the gate insulating layer, an orthogonal projection of the first via hole on the base substrate and an orthogonal projection of the signal line on the base substrate have an overlapping area, the source-drain metal pattern comprises a source-drain electrode wire, the source-drain electrode wire is electrically connected to the signal line through the first via hole, and one surface of a portion of the source-drain electrode wire in the peripheral area near the base substrate is in contact with the gate insulating layer;
wherein the array substrate further comprises a first passivation layer and a first electrode pattern, the first passivation layer is at a side of the source-drain metal pattern away from the base substrate, and the first electrode pattern is at a side of the first passivation layer away from the base substrate;
the first electrode pattern comprises an electrode lead wire in the peripheral area and an electrode protection sub-pattern in the peripheral area, the electrode protection sub-pattern and the electrode lead wire are insulated from each other;
the source-drain metal pattern further comprises a source electrode, a drain electrode and a source-drain signal transmission line, the gate metal pattern further comprises a gate signal transmission line, the signal line transmits a signal to one of the source electrode and the drain electrode via the source-drain signal transmission line, and the signal line transmits a signal to the gate electrode via the gate signal transmission line; and
wherein an orthogonal projection of the electrode protection sub-pattern on the base substrate covers an orthogonal projection of the source-drain signal transmission line in the peripheral area on the base substrate and an orthogonal projection of the gate signal transmission line in the peripheral area on the base substrate.

2. The array substrate according to claim 1, wherein the first passivation layer is provided with a second via hole penetrating the first passivation layer, an orthogonal projection of the second via hole on the base substrate and an orthogonal projection of the first via hole on the base substrate have no overlapping area, and the source-drain electrode wire is electrically connected to the electrode lead wire through the second via hole.

3. The array substrate according to claim 2, wherein the array substrate further comprises a second electrode pattern, the second electrode pattern is between the gate insulating layer and the first passivation layer, and an orthogonal projection of the second electrode pattern on the base substrate and an orthogonal projection of the first electrode pattern on the base substrate have a non-overlapping area.

4. The array substrate according to claim 3, wherein
the first electrode pattern and the second electrode pattern are respectively one of a pixel electrode pattern and a common electrode pattern.

5. The array substrate according to claim 1, wherein the array substrate further comprises an active layer pattern; and
the active layer pattern is between the gate insulating layer and the source-drain metal pattern, and the active layer pattern is in the display area.

6. The array substrate according to claim 1, wherein
a preparing material of the gate metal pattern comprises aluminum, tantalum, or molybdenum; and
a preparing material of the source-drain metal pattern comprises aluminum, tantalum, or molybdenum.

7. The array substrate according to claim 1, wherein the array substrate further comprises a second electrode pattern and an active layer;
the second electrode pattern is between the gate insulating layer and the first passivation layer, and an orthogonal projection of the second electrode pattern on the base substrate and an orthogonal projection of the first electrode pattern on the base substrate have a non-overlapping area;
the active layer pattern is between the gate insulating layer and the source-drain metal pattern, the active layer pattern is in the display area;
the first electrode pattern and the second electrode pattern are respectively one of a pixel electrode pattern and a common electrode pattern;
a preparing material of the gate metal pattern comprises at least one of aluminum, tantalum, and molybdenum;
a preparing material of the source-drain metal pattern comprises at least one of aluminum, tantalum, and molybdenum; and
a preparing material of the first passivation layer comprises at least one of silicon dioxide and silicon nitride.

8. A method for manufacturing an array substrate, wherein the array substrate comprises a display area and a peripheral area around the display area, and the method comprises:
providing a base substrate;
sequentially forming a gate metal pattern and a gate insulating layer on the base substrate, wherein the gate metal pattern comprises a signal line and a gate electrode, and the signal line is in the peripheral area;
forming a first via hole penetrating the gate insulating layer by a patterning process, wherein an orthogonal projection of the first via hole on the base substrate and an orthogonal projection of the signal line on the base substrate have an overlapping area; and
forming a source-drain metal pattern on the base substrate, wherein the source-drain metal pattern comprises a source-drain electrode wire, the source-drain electrode wire is electrically connected to the signal line through the first via hole, and one surface of a portion of the source-drain electrode wire in the peripheral area near the base substrate is in contact with the gate insulating layer;
forming a first passivation layer on the base substrate on which the source-drain metal pattern is formed, wherein the first passivation layer is at a side of the source-drain metal pattern away from the base substrate;
forming a first electrode pattern on the base substrate on which the first passivation layer is formed, wherein the first electrode pattern is at a side of the first passivation layer away from the base substrate, the first electrode pattern comprises an electrode lead wire in the peripheral area and an electrode protection sub-pattern in the peripheral area, the electrode protection sub-pattern and the electrode lead wire are insulated from each other;
the source-drain metal pattern further comprises a source electrode, a drain electrode and a source-drain signal transmission line, the gate metal pattern further comprises a gate signal transmission line, the signal line transmits a signal to one of the source electrode and the drain electrode via the source-drain signal transmission line, and the signal line transmits a signal to the gate electrode via the gate signal transmission line; and
wherein an orthogonal projection of the electrode protection sub-pattern on the base substrate covers an orthogonal projection of the source-drain signal transmission line in the peripheral area on the base substrate and an orthogonal projection of the gate signal transmission line in the peripheral area on the base substrate.

9. The method according to claim 8, wherein after sequentially forming the gate metal pattern and the gate insulating layer on the base substrate, the method further comprises:
forming an active layer on the base substrate on which the gate insulating layer is formed; and
forming the first via hole penetrating the gate insulating layer by a patterning process comprises:
forming the first via hole penetrating the active layer and the gate insulating layer by a patterning process, and forming an active layer pattern by the patterning process, the active layer pattern is in the display area.

10. The method according to claim 9, wherein forming the first via hole penetrating the active layer and the gate insulating layer by a patterning process, and forming an active layer pattern by a patterning process, comprises:
forming a photoresist layer on one surface of the active layer away from the base substrate;
exposing the photoresist layer by using a half tone mask from one side of the photoresist layer away from the base substrate;
developing the photoresist layer after being exposed to form a photoresist pattern, wherein the photoresist pattern comprises a first sub-pattern and a second sub-pattern, the first sub-pattern is at a side of a channel area away from the base substrate, and a thickness of the first sub-pattern is greater than a thickness of the second sub-pattern;
etching the active layer and the gate insulating layer by an etching process to form the first via hole in a target area, wherein the target area comprises an area other than an area covered by an orthogonal projection of the photoresist pattern on the active layer;
removing the second sub-pattern by an aching process, and etching the active layer by a dry etching process, to form the active layer pattern; and
removing the first sub-pattern.

11. The method according to claim 10, wherein the half tone mask comprises a first light-transmitting area, a second light-transmitting area, and a light-shielding area, and a transmittance of the first light-transmitting area is greater than a transmittance of the second light-transmitting area;
exposing the photoresist layer by using a half tone mask comprises:
exposing the photoresist layer by using the half tone mask, such that the photoresist layer after being exposed forms a first exposure area corresponding to the first light-transmitting area, a second exposure area corresponding to the second light-transmitting area, and a non-exposure area corresponding to the light-shielding area; and developing the photoresist layer after being exposed to form a photoresist pattern, comprises:

developing the photoresist layer after being exposed, to remove the photoresist in the first exposure area, and to enable the second exposure area to form the second sub-pattern, and the non-exposure area to form the first sub-pattern.

12. The method according to claim 10, wherein etching the active layer and the gate insulating layer by an etching process comprises:

etching the active layer and the gate insulating layer by a dry etching process.

13. The method according to claim 8, after forming the source-drain metal pattern on the base substrate on which the active layer pattern is formed, further comprises:

forming a second via hole penetrating the first passivation layer in the first passivation layer by a patterning process, wherein an orthogonal projection of the second via hole on the base substrate and an orthogonal projection of the first via hole on the base substrate have no overlapping area, and the electrode lead wire is electrically connected to the source-drain electrode wire through the second via hole.

14. The method according to claim 13, wherein after sequentially forming the gate metal pattern, the gate insulating layer and the active layer on the base substrate, the method further comprises:

forming a second electrode pattern on the base substrate on which the active layer pattern is formed by a patterning process; and forming a first passivation layer on the base substrate on which the source-drain metal pattern is formed comprises:

forming the first passivation layer on the base substrate on which the second electrode pattern and the source-drain metal pattern are formed.

15. A display panel, comprising: an array substrate, wherein the array substrate comprises a display area and a peripheral area which is around the display area, and the array substrate comprises:

a base substrate, and a gate metal pattern, a gate insulating layer and a source-drain metal pattern which are sequentially disposed on the base substrate;

wherein the gate metal pattern comprises a signal line and a gate electrode, the signal line is in the peripheral area, the gate insulating layer is provided with a first via hole penetrating the gate insulating layer, an orthogonal projection of the first via hole on the base substrate and an orthogonal projection of the signal line on the base substrate have an overlapping area, the source-drain metal pattern comprises a source-drain electrode wire, the source-drain electrode wire is electrically connected to the signal line through the first via hole, and one surface of a portion of the source-drain electrode wire in the peripheral area near the base substrate is in contact with the gate insulating layer;

wherein the array substrate further comprises a first passivation layer and a first electrode pattern, the first passivation layer is at a side of the source-drain metal pattern away from the base substrate, and the first electrode pattern is at a side of the first passivation layer away from the base substrate;

the first electrode pattern comprises an electrode lead wire in the peripheral area and an electrode protection sub-pattern in the peripheral area, the electrode protection sub-pattern and the electrode lead wire are insulated from each other;

the source-drain metal pattern further comprises a source electrode, a drain electrode and a source-drain signal transmission line, the gate metal pattern further comprises a gate signal transmission line, the signal line transmits a signal to one of the source electrode and the drain electrode via the source-drain signal transmission line, and the signal line transmits a signal to the gate electrode via the gate signal transmission line; and wherein an orthogonal projection of the electrode protection sub-pattern on the base substrate covers an orthogonal projection of the source-drain signal transmission line in the peripheral area on the base substrate and an orthogonal projection of the gate signal transmission line in the peripheral area on the base substrate.

16. The display panel according to claim 15, wherein the display panel further comprises a color filter substrate and a liquid crystal layer which is between the array substrate and the color filter substrate.

17. A display device, comprising a display panel according to claim 15.

* * * * *